(12) United States Patent  
Sculley

(10) Patent No.: US 6,326,818 B1  
(45) Date of Patent: Dec. 4, 2001

(54) DELTA-SIGMA SAMPLE AND HOLD

(75) Inventor: Terry L. Sculley, Austin, TX (US)

(73) Assignee: ESS Technology, Inc., Austin, TX (US)

( * ) Notice: Subject to any disclaimer, the term of this patent is extended or adjusted under 35 U.S.C. 154(b) by 0 days.

(21) Appl. No.: 09/527,554

(22) Filed: Mar. 16, 2000

Related U.S. Application Data

(60) Provisional application No. 60/124,680, filed on Mar. 16, 1999.

(51) Int. Cl.$^7$ .................................................. G11C 27/02
(52) U.S. Cl. .................................. 327/95; 327/94
(58) Field of Search ......................... 327/91–96, 337, 327/554, 307, 362, 363

(56) References Cited

U.S. PATENT DOCUMENTS

| | | | |
|---|---|---|---|
| 3,430,072 | * 2/1969 | Stevens | 327/95 |
| 4,404,479 | * 9/1983 | Toyomaki | 327/95 |
| 4,429,281 | 1/1984 | Ito et al. | 330/9 |
| 5,030,954 | * 7/1991 | Ribsen | 341/172 |
| 5,225,776 | 7/1993 | Dobos et al. | 324/121 R |
| 5,331,218 | 7/1994 | Moody et al. | 327/554 |
| 5,793,243 | * 8/1998 | Farrow | 327/95 |
| 5,973,518 | * 10/1999 | Vallancourt | 327/94 |
| 5,973,536 | 10/1999 | Maejima | 327/337 |
| 5,973,537 | 10/1999 | Baschirotto et al. | 327/337 |
| 5,994,928 | * 11/1999 | Chevallier | 327/95 |
| 6,052,000 | * 4/2000 | Nagaraj | 327/95 |

* cited by examiner

Primary Examiner—Toan Tran
(74) Attorney, Agent, or Firm—Gray Cary Ware & Freidenrich LLP

(57) ABSTRACT

A method and apparatus for performing voltage-mode sample and hold functions while avoiding nonlinear charge injection. The method comprises oversampling an input signal and sampling an error signal, not the input signal directly, and through signal processing causing the error signal to be reduced to low amplitude. First order and higher order voltage-mode sample and hold circuitry embodiments are provided.

16 Claims, 2 Drawing Sheets

DELTA-SIGMA SAMPLE AND HOLD

CROSS REFERENCE TO RELATED APPLICATIONS

This application claims the benefit of U.S. Provisional Application No. 60/124,680, filed Mar. 16, 1999.

TECHNICAL FIELD

This disclosure generally relates to electronic systems and more particularly, to the design of high linearity sample-and hold circuitry.

BACKGROUND

Some sample and hold (S/H) circuitry utilizes switched capacitors. The opening and closing of switches produces nonlinear charge injection effects. These nonlinear charge injection effects can be a problem in the design of high linearity sample-and hold circuitry. Careful control over impedances seen by the sampling switches are often needed. However, careful control over impedances can be difficult to maintain due to variations in common-mode voltages and other parameters such as over process and temperature extremes.

A method and apparatus for performing voltage-mode sample and hold functions with high linearity is desired.

SUMMARY

This disclosure provides a method and apparatus for performing voltage-mode sample and hold functions while avoiding nonlinear charge injection. The method comprises oversampling an input signal and sampling an error signal, not the input signal directly, and through signal processing causing the error signal to be reduced to low amplitude. First order and higher order voltage-mode sample and hold circuitry embodiments are provided.

DESCRIPTION OF DRAWINGS

These and other features and advantages of the invention will become more apparent upon reading the following detailed description and upon reference to the accompanying drawings.

DETAILED DESCRIPTION

Figure 1:
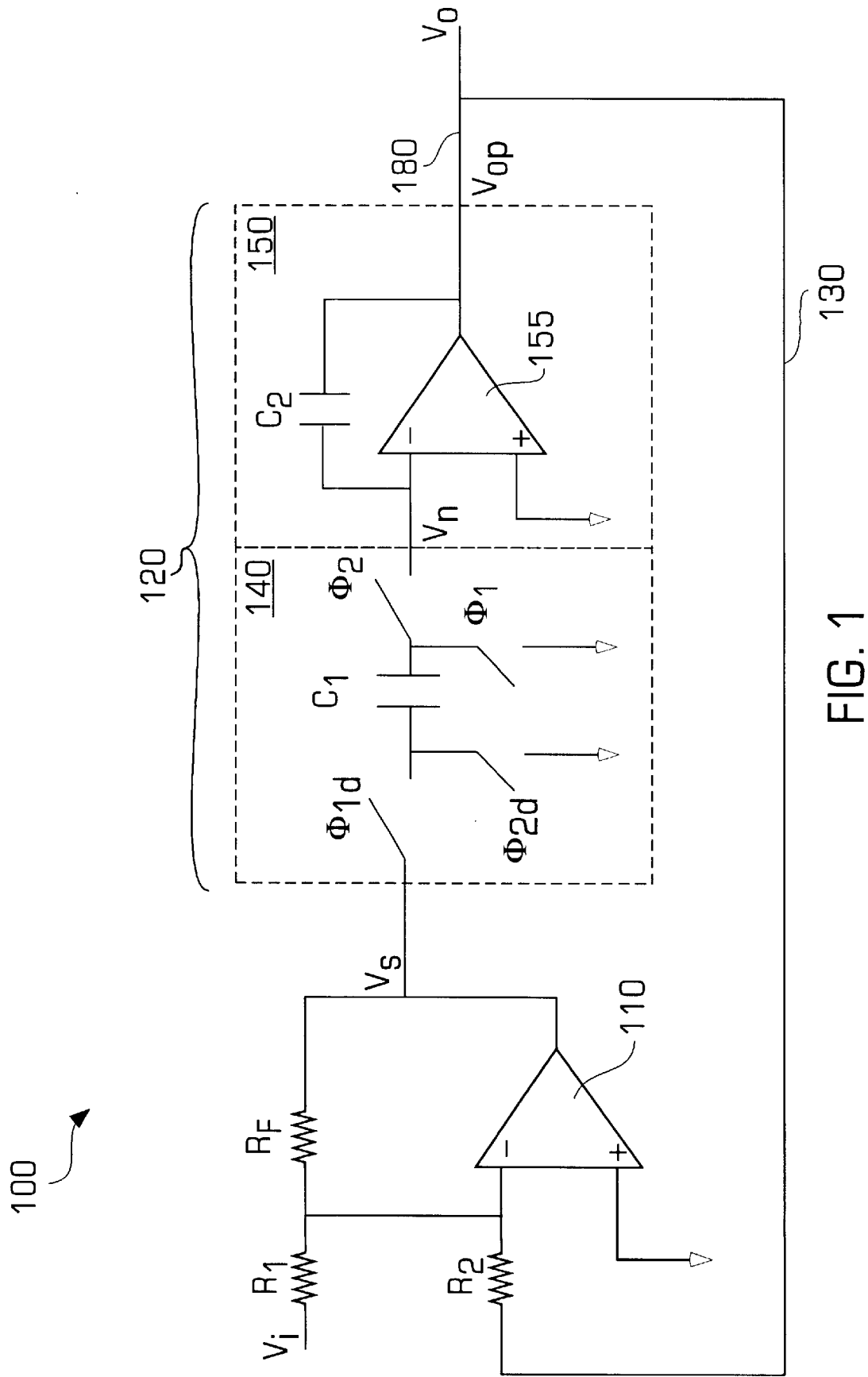
FIG. 1 shows a voltage-mode sample and hold circuitry with a single switched capacitor integrator.

FIG. 1 shows an embodiment of a first order voltage-mode sample and hold circuitry system. Input signal enters the first order voltage-mode sample and hold circuit 100 at node $V_i$. The signal travels through a resistor $R_1$ and enters the inverting terminal of a operational amplifier ("op amp") 110. The output of op amp 110 is sampled by the switched capacitor integrator 120. The non-inverting input of op amp 110 is connected to ground.

The switched capacitor integrator 120 receives an input at node $V_s$. The output $V_{op}$ of the switched capacitor integrator 120 is feedback by path 130 through the resistors $R_2$ and $R_F$ into the inverting terminal of the op amp 110. The signal at node $V_s$ is referred to as the error signal and is given by $V_s = -(R_F/R_1)*V_i - (R_F/R_2)*V_{op}$. During operation of circuit 100, the feedback operation of the circuit works to drive the error signal at node $V_s$ to approximately zero when the input signal is sufficiently oversampled. This results in $V_{op} \approx V_i$ at the sampling instants (i.e., when Φ1 opens each cycle).

The switched capacitor integrator 120 has a switched capacitor 140 and an integrator 150. One terminal of the switched capacitor $C_1$ is connected to switches Φ1d and Φ2d; the other terminal of the switched capacitor $C_1$ is connected to switches Φ1 and Φ2. In one embodiment, switches Φ1d and Φ1 are operable to close in response to generation of a clock signal Φ1 and switches Φ2d and Φ2 are operable to close in response to generation of a clock signal Φ2. The switched capacitor $C_1$ samples the signal from Vs when the switches Φ1d and Φ1 are closed, and dumps the charge thereon to a charge summing node $V_n$ after the switches Φ1d and Φ1 are opened and when switches Φ2d and Φ2 are closed.

The integrator 150 comprises an op amp 155 and a charge accumulating capacitor $C_2$. The capacitor $C_2$ is connected between the output of the op amp 155 and the inverting input of op amp 155. The inverting input of the op amp 155 comprises the charge summing node $V_n$. The non-inverting input thereof is connected to ground. The output of the integrator 150 is $V_{op}$.

In another embodiment, a voltage follow amplifier (not shown) with a gain of approximately +1 may be placed at a position 180 in circuit 100. This voltage follow amplifier may serve as a buffer at the output of the integrator 150.

The circuit 100 comprises a discrete-time op amp modeled with a single pole. The number of poles in a transfer function is equal to the number of independent energy-storing elements, e.g. capacitors, in the network. An independent capacitor is one to which an arbitrary voltage can be assigned independent of all other capacitor voltages.

The discrete-time op amp is placed in feedback and the circuit 100 has a transfer function as shown in equation (1):

$$\frac{V_o}{V_i} = \frac{-\frac{R_F C_1}{R_1 C_1} z^{-1}}{1 - \left(1 - \frac{R_F C_1}{R_2 C_2}\right) z^{-1}} \quad (1)$$

where $z^{-1} = e^{Ts}$; T is the sampling period; $s = J\omega$. Hence, the DC gain, where $\omega=0$, $z^{-1}=1$, is $-R_2/R_1$, with a single pole response in the z domain. In other words, if the signal bandwidth is restricted to frequencies much lower than the sampling rate (i.e., highly oversampled), then $z \approx 1$ and $V_o/V_i$ approaches $-R_2/R_1$; the circuit 100 is then insensitive to forward gain.

The transfer function from $V_i$ to $V_s$ is given by equation (2):

$$\frac{V_s}{V_i} = \frac{-\frac{R_F}{R_1}(1 - z^{-1})}{1 - \left(1 - \frac{R_F C_1}{R_2 C_2}\right) z^{-1}} \quad (2)$$

At DC, where $\omega=0$, $z^{-1}=1$, the transfer function, $V_s/V_i=0$. The magnitude of $V_s$ goes to zero as the input frequency approaches DC or is close to DC.

This system shares some common features with a delta-sigma(ΔΣ) modulator, except that the present system does not have a quantizer and a continuous-time difference stage before the sampling operation occurs. An attractive property common to both the present system and the ΔΣ structures is that of noise-shaping. Although the system of FIG. 1 does not have quantization noise injected as a conventional ΔΣ modulator does, the principle of noise-shaping can be exploited to reduce the effects of output-referred nonlinearity of the switched capacitor integrator 120. The nonlinearity can be modeled as an additive "noise" source at the integrator output, even though the noise really has only signal harmonics. As in the case of a ΔΣ modulator, increased oversampling leads to reduced output "noise" and thus higher resolution.

In FIG. 1, the sampling operation from the $\Phi_1$ switch can cause nonlinear charge injection. However, this nonlinearity has the property that the harmonic distortion produced by the nonlinearity drops as the amplitude at node $V_s$ drops. If the amplitude of $V_s$ drops by a factor $\alpha$, the harmonic distortion caused by the nonlinear charge injection will typically drop by a factor larger than $\alpha$. Thus, if the maximum amplitude of $V_s$ can be held at some low level, then the total system harmonic distortion will be lower than if $V_s$ is allowed to have a higher maximum amplitude.

The amplitude of $V_s$ can be limited by oversampling the input signal with the feedback error signal, which in z domain tends to cause the input to get closer and closer to DC, e.g. z≈1, proportional to the system sampling rate. As a result of this error signal feedback, the zero at DC in the $V_s/V_i$ transfer function attenuates the input more. This results in a lower and lower maximum amplitude for $V_s$ as the sampling rate is increased with a constant frequency, constant amplitude input signal. High-order harmonics are typically so low in amplitude that they are considered negligible, while low order harmonics are still attenuated by the noise-shaping.

Reduction of $V_s$ provides insensitivity to input-referred integrator nonlinearity, a characteristic not shared by conventional ΔΣ modulators. The reason for this difference from a ΔΣ is seen in the characteristic of the integrator input signal. In a conventional ΔΣ modulator, this signal is the difference between the slowly varying analog input and a high speed output pulse train, yielding a high speed, widely varying integrator input. In FIG. 1, however, the integrator input is given by $V_s$, which is seen to have amplitude approaching zero as oversampling increases. This results in a sampled-data virtual ground node.

In a preferred embodiment, the closed-loop gain $V_o/V_i$ is selected to be approximately 0dB for desired linearity results.

Figure 2:
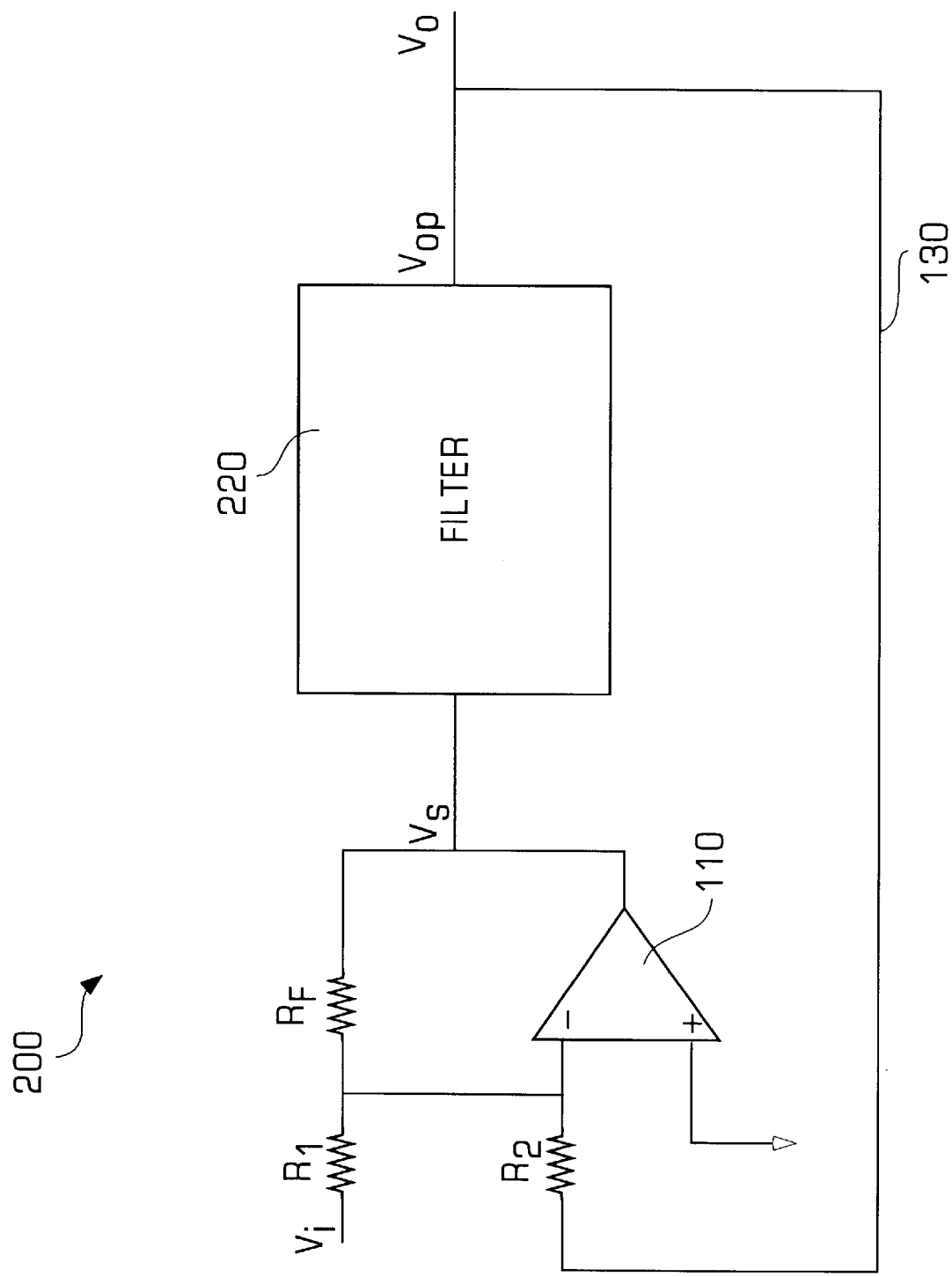
FIG. 2 shows a voltage-mode sample and hold circuitry with a higher order switched capacitor filter in a single-ended design style.

The system illustrated in FIG. 1 can easily be extended to a fully differential architecture. FIG. 2 shows another embodiment featuring a higher order switched capacitor filter in place of the single switched capacitor integrator of FIG. 1. Errors can be reduced further by increasing the order of the structure. This adds more zeros in the error transfer function, which can then be placed at or near DC to obtain higher resolution at the same oversampling ratio.

In FIG. 2, the input signal enters the higher order voltage-mode sample and hold circuit 200 at node $V_i$. The signal travels through a resistor $R_1$ and enters the inverting terminal of the op amp 110. The output of op amp 110 is sampled by the higher order switched capacitor filter 220. The higher order switched capacitor filter 220 may include multiple stages of switch capacitor integrators.

The higher order switched capacitor filter 220 receives an input at node $V_s$. The output $V_{op}$ of the higher order switched capacitor filter 220 is feedback by path 130 through the resistors $R_2$ and $R_F$ into the inverting terminal of the op amp 110. The signal of node $V_s$ is referred to as the error signal. Node $V_s$ has two inputs, namely, the input signal $V_i$ and the output signal $V_{op}$. During operation of circuit 200, the error signal is sampled allowing it to be reduced to low amplitude which improves the linearity of the system.

In general, the switched capacitor filter selected has a high gain in the spectral region where the input signal is expected to reside. In the previous embodiment, as shown in FIG. 1, a single integrator is used. This integrator has high gain for frequencies near DC and thus is useful for performing sample and hold functions of signals in the DC region. FIG. 2 illustrates a higher order system using a switched capacitor filter which may have high gain in some bandpass spectral region. This filter can be used in a sample and hold system for signals limited to those frequencies in the passband of the bandpass filter.

Higher order structures using multiple stages can provide higher performance at lower oversampling ratios. Such systems have zeros in the transfer functions from $V_i$ to each internal node in the sample and hold switched capacitor filter where sampling occurs, so that the amplitude of each of these node voltages is forced low in the spectral band of interest. This causes the use of a higher order switched capacitor filter to yield even higher linearity (e.g., lower system harmonic distortion) for a lower oversampling ratio.

Although only a few embodiments have been described in detail above, those having ordinary skill in the art will certainly understand that many modifications are possible in the preferred embodiment without departing from the teachings thereof.

What is claimed is:

1. A method of performing high linearity voltage-mode sample and hold comprising:
   operating a circuit at an oversampled rate;
   forming an error signal which represents the error from an input signal in a sample and hold output;
   sampling the error signal at the oversampled rate;
   altering the sample and hold output to modify the error signal.

2. The method of claim 1, wherein the oversampling rate is more than twice the bandwidth of an input signal.

3. The method of claim 1, wherein the modification to the error signal indicates reduced error.

4. A method of performing high linearity voltage-mode sample and hold comprising:
   operating a circuit at an oversampled rate;
   forming an error signal which represents the error from an input signal in a sample and hold output;
   sampling the error signal at the oversampled rate; and
   inputting the sampled error signal into a switched-capacitor filter which alters the sample and hold output to modify the error signal.

5. The method of claim 4, wherein the oversampling rate is more than twice the bandwidth of an input signal.

6. The method of claim 4, wherein the modification to the error signal indicates reduced error.

7. The method of claim 4, wherein the switched-capacitor filter has a high gain for input signals at low frequencies relative to the oversampled rate.

8. The method of claim 4, wherein the switched-capacitor filter has a first gain in a passband range and a second gain in a stopband range, the first gain being greater than the second gain.

9. The method of claim 8, wherein at least a portion of the input signal is in the passband range.

10. The method of claim 4, wherein the switched-capacitor filter is a switched-capacitor integrator.

11. The method of claim 4, wherein the switched-capacitor filter is a series of cascaded switched-capacitor integrators.

12. The method of claim 4, wherein the switched-capacitor filter has one or more poles on or relatively close to the a unit circle in the z-transform domain.

13. A first order high linearity voltage-mode sample and hold circuit comprising:
- a first node;
- a first input signal at said first node;
- a first operational amplifier having an inverting terminal, a non-inverting terminal and an first output;
- a first resistor connected between said first node and said first operational amplifier at said inverting terminal;
- a second node at said first output;
- a switched capacitor connected to the second node positioned to sample said first input signal, wherein said switched capacitor comprises a capacitor regulated by a first, a second, a third and a fourth switch, said sample occurs when said first and said second switches are closed;
- an integrator having a second operational amplifier with a second inverting terminal, second non-inverting terminal, and a second output and a feedback capacitor connected between said second output and said second inverting terminal, said integrator is connected to said switched capacitor integrator and a output of said circuit;
- a third node positioned between said switched capacitor and said integrator, wherein said switched capacitor dumps said signal onto a third node when said third and said fourth switches are closed;
- a feedback circuit, wherein said second output is feedback into the inverting terminal of said first operational amplifier;
- a second resistor positioned in the path of said feedback circuit and connected to the inverting terminal of said first operational amplifier; and
- a feedback resistor connected between said first output of said first operational amplifier and said inverting terminal of said first operational amplifier.

14. A circuit as in claim 13, further comprising a voltage follower amplifier with a gain of approximately +1 positioned as a buffer at said third node.

15. An higher order voltage-mode sample and hold circuit comprising:
- a first node;
- a first input signal at said first node;
- a first operational amplifier having an inverting terminal, a non-inverting terminal and an first output;
- a first resistor connected between said first node and said first operational amplifier at said inverting terminal;
- a second node at said first output;
- a multi-staged switched capacitor filter connected to the second node positioned to sample and hold said first input signal;
- a feedback circuit, wherein said second output is feedback into the inverting terminal of said first operational amplifier;
- a second resistor positioned in the path of said feedback circuit and connected to the inverting terminal of said first operational amplifier; and
- a feedback resistor connected between said first output of said first operational amplifier and said inverting terminal of said first operational amplifier.

16. A circuit as in claim 15, further comprising a voltage follower amplifier with a gain of approximately +1 positioned as a buffer at said second node.

\* \* \* \* \*